(12) United States Patent
Jung et al.

(10) Patent No.: US 11,217,503 B2
(45) Date of Patent: Jan. 4, 2022

(54) SEMICONDUCTOR PACKAGE HAVING LOGIC SEMICONDUCTOR CHIP AND MEMORY PACKAGES ON INTERPOSER

(71) Applicant: SAMSUNG ELECTRONICS CO., LTD., Suwon-si (KR)

(72) Inventors: Yang Gyoo Jung, Hwaseong-si (KR); Chul Woo Kim, Incheon (KR); Hyo-Chang Ryu, Cheonan-si (KR); Seung-Kwan Ryu, Seongnam-si (KR); Yun Seok Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 57 days.

(21) Appl. No.: 16/748,061

(22) Filed: Jan. 21, 2020

(65) Prior Publication Data
US 2020/0395346 A1 Dec. 17, 2020

(30) Foreign Application Priority Data
Jun. 12, 2019 (KR) .................. 10-2019-0069093

(51) Int. Cl.
*H01L 23/367* (2006.01)
*H01L 23/42* (2006.01)
(Continued)

(52) U.S. Cl.
CPC ............ *H01L 23/367* (2013.01); *H01L 23/42* (2013.01); *H01L 23/49816* (2013.01); *H01L 24/16* (2013.01); *H01L 25/0657* (2013.01); *H01L 25/105* (2013.01); *H05K 1/181* (2013.01); *H01L 2224/16225* (2013.01); *H01L 2225/06541* (2013.01); *H05K 2201/10159* (2013.01); *H05K 2201/10378* (2013.01); *H05K 2201/10734* (2013.01)

(58) Field of Classification Search
CPC . H01L 23/105; H01L 23/42; H01L 23/49816; H01L 24/16; H01L 25/0657; H05K 1/181
See application file for complete search history.

(56) References Cited

U.S. PATENT DOCUMENTS

| 8,349,649 B2 | 1/2013 | Kurita |
| 9,299,689 B2 | 3/2016 | Oh |

(Continued)

*Primary Examiner* — Michael Jung
(74) *Attorney, Agent, or Firm* — F. Chau & Associates, LLC

(57) ABSTRACT

A semiconductor package includes a substrate and an interposer disposed on the substrate. The interposer comprises a first surface facing the substrate and a second surface facing away from the substrate. A first logic semiconductor chip is disposed on the first surface of the interposer and is spaced apart from the substrate in a first direction orthogonal to an upper surface of the substrate. A first memory package is disposed on the second surface of the interposer. A second memory package is disposed on the second surface of the interposer and is spaced apart from the first memory package in a second direction that is parallel to the upper surface of the substrate. A first heat transfer unit is disposed on a surface of the substrate facing the first logic semiconductor chip. The first heat transfer unit is spaced apart from the first logic semiconductor chip in the first direction.

19 Claims, 13 Drawing Sheets

(51) Int. Cl.
  *H01L 25/10*      (2006.01)
  *H01L 25/065*     (2006.01)
  *H01L 23/498*     (2006.01)
  *H05K 1/18*       (2006.01)
  *H01L 23/00*      (2006.01)

(56) References Cited

U.S. PATENT DOCUMENTS

| | | |
|---|---|---|
| 9,396,998 B2 | 7/2016 | Kurita et al. |
| 9,917,045 B2 | 3/2018 | Chaparala et al. |
| 10,170,399 B2 | 1/2019 | Ho et al. |
| 2012/0280404 A1* | 11/2012 | Kwon .................. H01L 21/565 |
| | | 257/777 |
| 2013/0001798 A1* | 1/2013 | Choi ................ H01L 23/49827 |
| | | 257/774 |
| 2013/0043584 A1* | 2/2013 | Kwon ............... H01L 23/49822 |
| | | 257/737 |
| 2013/0049224 A1* | 2/2013 | Sutardja ................ H01L 27/108 |
| | | 257/774 |
| 2013/0307155 A1* | 11/2013 | Mitsuhashi ............. H01L 25/50 |
| | | 257/761 |
| 2015/0206854 A1* | 7/2015 | Lane .................... H01L 25/105 |
| | | 257/738 |
| 2016/0260684 A1* | 9/2016 | Zhai ...................... H01L 21/568 |
| 2017/0373021 A1 | 12/2017 | Usami et al. |
| 2018/0190635 A1 | 7/2018 | Choi et al. |
| 2019/0067249 A1 | 2/2019 | Huang et al. |

* cited by examiner

FIG. 3
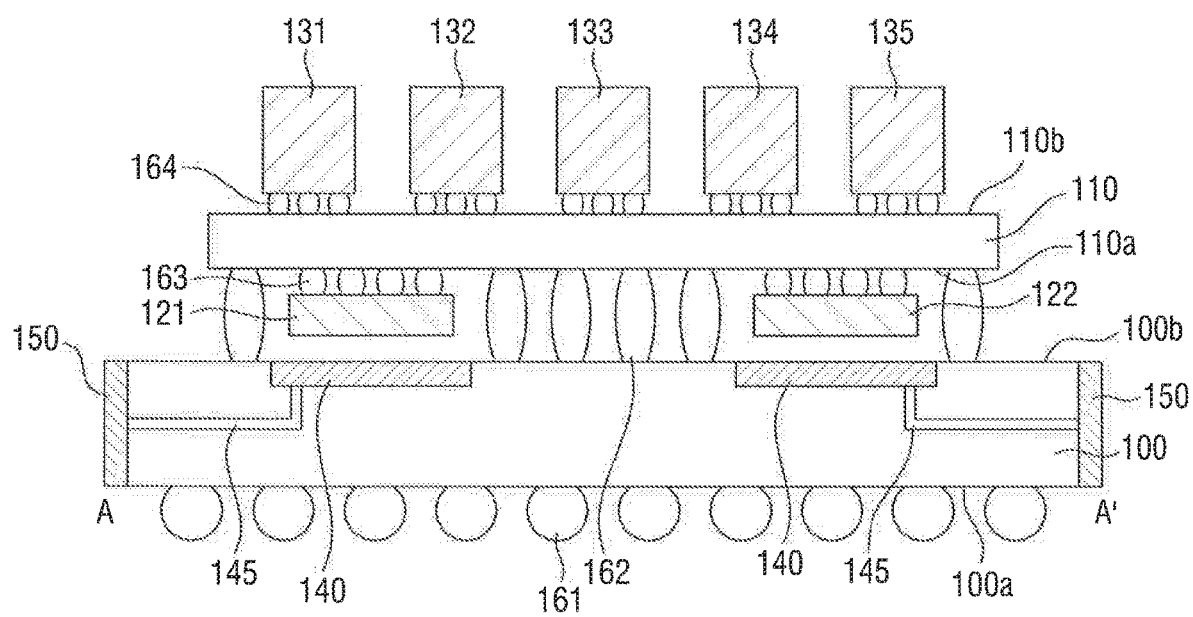
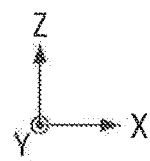

SEMICONDUCTOR PACKAGE HAVING LOGIC SEMICONDUCTOR CHIP AND MEMORY PACKAGES ON INTERPOSER

CROSS-REFERENCE TO RELATED APPLICATION

This application claims priority under 35 U.S.C. § 119 to Korean Patent Application No. 10-2019-0069093, filed on Jun. 12, 2019 in the Korean Intellectual Property Office (KIPO), the disclosure of which is incorporated by reference in its entirety herein.

1. TECHNICAL FIELD

The present inventive concepts relate to a semiconductor package.

2. DISCUSSION OF RELATED ART

The importance of electronic devices having a high performance, a fast operating speed, and miniaturization of the electronic elements has increased with the rapid development of the electronic industry. Methods for stacking and populating several semiconductor chips on a single package substrate or a method for stacking another package on a package may be used to provide these features. For example, a package-in-package PIP type of a semiconductor package or a package-on-package POP type of a semiconductor package may be provided.

SUMMARY

A technical object of the present inventive concepts is to provide a semiconductor package increasing a memory package populated therewithin by disposing a plurality of logic semiconductor chips electrically and directly connected to an interposer on a lower surface of the interposer and disposing a plurality of memory packages electrically and directly connected to the interposer on an upper surface of the interposer.

Another technical object of the present inventive concepts is to provide a semiconductor package enhanced with reliability by disposing a heat transfer unit on an upper surface of a substrate facing a plurality of logic semiconductor chips and efficiently discharging heat generated from a plurality of logic semiconductor chips to an external region.

According to an exemplary embodiment of the present inventive concepts, there is provided a semiconductor package that includes a substrate and an interposer disposed on the substrate. The interposer comprises a first surface facing the substrate and a second surface facing away from the substrate. A first logic semiconductor chip is disposed on the first surface of the interposer and is spaced apart from the substrate in a first direction orthogonal to an upper surface of the substrate. A first memory package is disposed on the second surface of the interposer. A second memory package is disposed on the second surface of the interposer and is spaced apart from the first memory package in a second direction that is parallel to the upper surface of the substrate. A first heat transfer unit is disposed on a surface of the substrate facing the first logic semiconductor chip. The first heat transfer unit is spaced apart from the first logic semiconductor chip in the first direction.

According to an exemplary embodiment of the present disclosure, a semiconductor package comprises a substrate that includes a first heat transfer unit disposed on an upper surface of the substrate. An interposer is disposed on the substrate. The interposer includes a first surface facing the substrate and a second surface facing away from the substrate. The interposer is connected to the substrate. A logic semiconductor chip is disposed on the first surface of the interposer. The logic semiconductor chip overlaps with the first heat transfer unit in a first direction orthogonal to the upper surface of the substrate. The logic semiconductor chip is spaced apart from the first heat transfer unit in the first direction. The logic semiconductor chip is connected to the interposer. A first memory package is disposed on the second surface of the interposer. The first memory package is connected to the interposer.

According to an exemplary embodiment of the present inventive concepts, there is provided a semiconductor package that includes a substrate comprising a first solder ball disposed on a lower surface. An interposer is disposed on an upper surface of the substrate. The interposer includes a first surface facing the substrate and a second surface facing away from the substrate. A second solder ball is configured to connect the upper surface of the substrate and the first surface of the interposer. A first logic semiconductor chip is disposed on the first surface of the interposer. The first logic semiconductor chip is spaced apart from the upper surface of the substrate in a first direction that is orthogonal to the upper surface of the substrate. A third solder ball connects the first surface of the interposer and the first logic semiconductor chip. A first memory package is disposed on the second surface of the interposer. The first memory package includes a plurality of memory semiconductor chips that are stacked in the first direction. A second memory package spaced apart from the first memory package in a second direction that is parallel to the upper surface of the substrate. A fourth solder ball is configured to connect the second surface of the interposer and each of the first and second memory packages. A first heat transfer unit is disposed on the upper surface of the substrate and overlaps the first logic semiconductor chip in the first direction. The first heat transfer unit is spaced apart from the first logic semiconductor chip in the first direction.

The objectives that are intended to be addressed by the present inventive concepts are not limited to those mentioned above, and other objectives that are not mentioned above may be clearly understood to those skilled in the art based on the description provided below.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which:

FIG. 3 is a cross-sectional view taken along line A-A' of FIGS. 1 and 2 according to an exemplary embodiment of the present inventive concepts;

DETAILED DESCRIPTION OF THE EXEMPLARY EMBODIMENTS

Hereinbelow, a semiconductor package according to some exemplary embodiments of the present inventive concepts will be described with reference to FIGS. 1 to 4.

Figure 1:
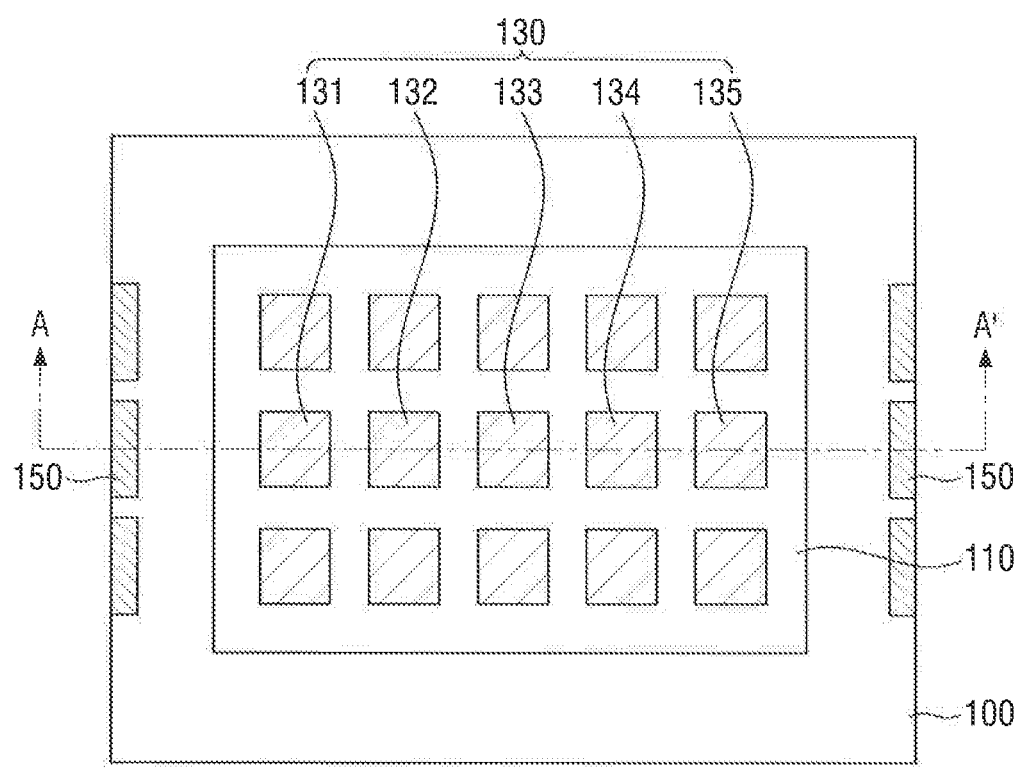
FIG. 1 is a top plan view illustrating a substrate, memory packages and second heat transfer units of a semiconductor package according to an exemplary embodiment of the present inventive concepts.
Figure 2:
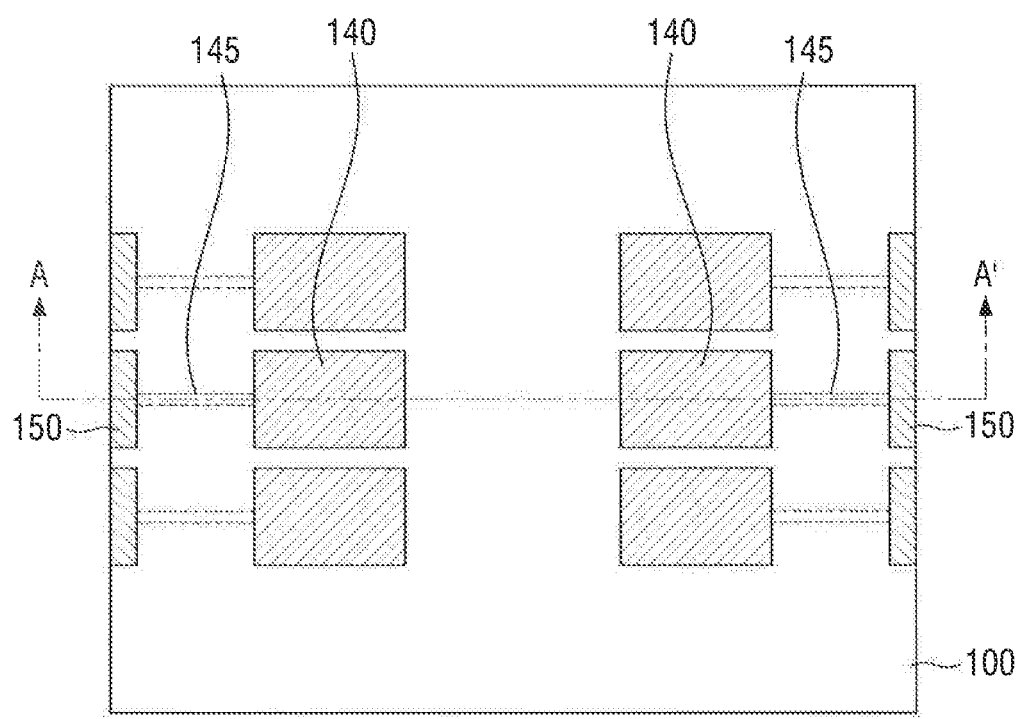
FIG. 2 is a top plan view illustrating a substrate and heat transfer units of a semiconductor package according to an exemplary embodiment of the present inventive concepts.
Figure 4:
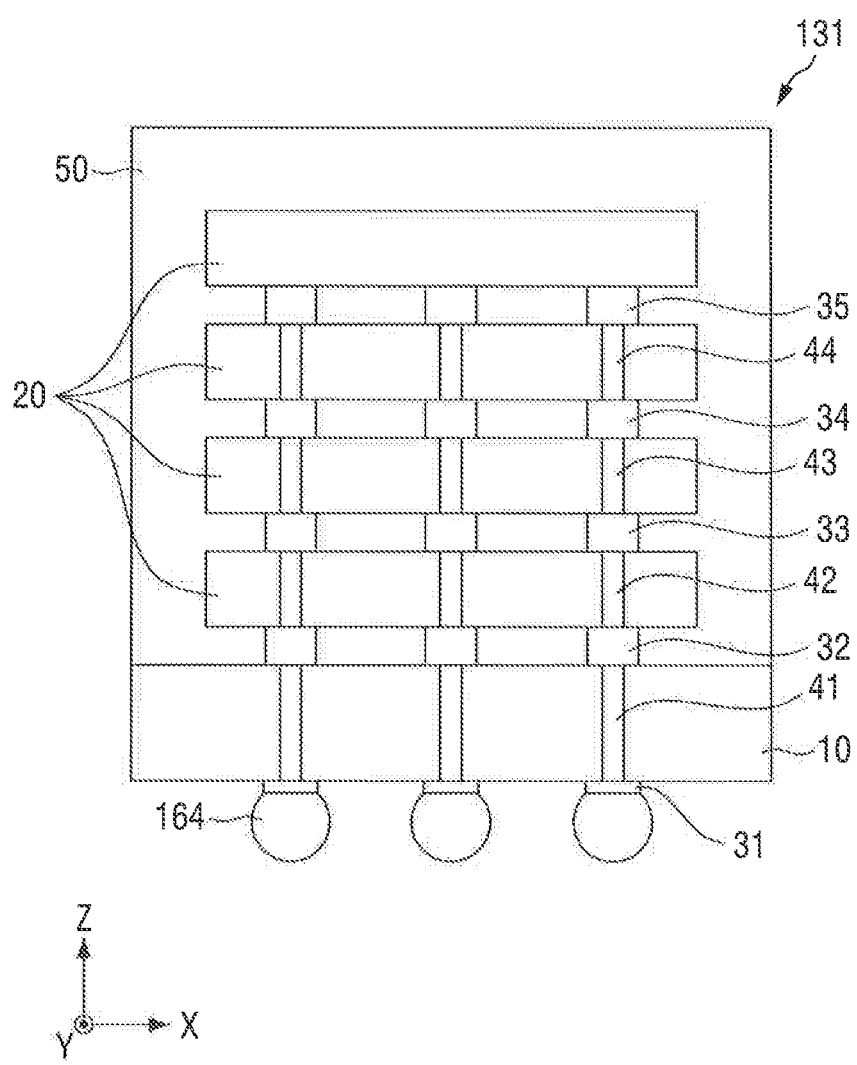
FIG. 4 is a cross-sectional view showing a memory package of the semiconductor package according to an exemplary embodiment.

FIG. 1 is a top plan view illustrating a substrate, memory packages and second heat transfer units of a semiconductor package according to an exemplary embodiment. FIG. 2 is a top plan view illustrating a substrate and heat transfer units of a semiconductor package according to an exemplary embodiment of the present inventive concepts. FIG. 3 is a cross-sectional view taken along line A-A' of FIG. 1. FIG. 4 is a cross-sectional view showing a memory package of the semiconductor package according to an exemplary embodiment.

Referring to FIGS. 1 to 4, the semiconductor package according to an exemplary embodiment includes a substrate 100, an interposer 110, first and second logic semiconductor chips 121, 122, first to fifth memory packages 131, 132, 133, 134, 135, a first heat transfer unit 140, a connector 145, a second heat transfer unit 150, and first to fourth solder balls 161, 162, 163, 164.

In an exemplary embodiment, the substrate 100 may be a PCB (printed circuit board) or a ceramic substrate. However, exemplary embodiments of the present inventive concepts are not limited thereto.

In an exemplary embodiment in which the substrate 100 is a PCB, the substrate 100 may include at least one material selected from phenol resin, epoxy resin, and polyimide. For example, the substrate 100 may include at least one material selected from FR4, tetrafunctional epoxy, polyphenylene ether, epoxy/polyphenylene oxide, bismaleimide triazine BT, thermount, cyanate ester, polyimide, and liquid crystal polymer. A surface of the substrate 100 may be covered by solder-resist. However, exemplary embodiments of the present inventive concepts are not limited thereto.

The substrate 100 may include a lower surface 100a and an upper surface 100b opposing each other. For example, the lower surface 100a and the upper surface 100b may be spaced apart in a first direction Z (hereinafter, the "Z direction"). The Z direction may be orthogonal to an upper surface 100b of the substrate 100.

The first solder ball 161 may be disposed on the lower surface 100a of the substrate 100. For example, as shown in the exemplary embodiment of FIG. 3, the first solder ball 161 may comprise a plurality of discrete solder balls that are spaced apart from each other. The plurality of discrete solder balls may be spaced apart from each other in a second direction X (hereinafter, the "X direction") that is orthogonal to the first direction Z and/or a third direction Y that is orthogonal to each of the Z direction and the X direction (hereinafter, the "Y direction"). For example, the X direction may extend parallel to an upper surface of the substrate 100. In an exemplary embodiment, the first solder ball 161 may be in contact with a conductive socket disposed on a lower surface 100a of the substrate 100. The first solder ball 161 may protrude from a lower surface 100a of the substrate 100 (e.g., in the Z direction). The first solder ball 161 may be configured to electrically connect the substrate 100 to another external socket, such as the conductive socket contacting the first solder ball.

In an exemplary embodiment, the first solder ball 161 may include at least one selected from tin (Sn), indium (In), lead (Pb), zinc (Zn), nickel (Ni), gold (Au), silver (Ag), copper (Cu), antimony (Sb), bismuth (Bi), and a combination thereof. However, exemplary embodiments of the present inventive concepts are not limited thereto.

The interposer 110 may be disposed on an upper surface 100b of the substrate 100. The interposer 110 may include a first surface 110a facing an upper surface 100b of the substrate 100 and a second surface 110b opposing the first surface 110a (e.g., facing away from the substrate). For example, as shown in the exemplary embodiment of FIG. 3, the first surface 110a may be on a bottom side of the interposer 110 (e.g., in the Z direction) and the second surface 110b may be on a top side of the interposer (e.g., in the Z direction).

In an exemplary embodiment, the interposer 110 may include at least one selected from silicone, glass, ceramic or plastic. However, exemplary embodiments of the present inventive concepts are not limited thereto.

The interposer 110 may be electrically and physically connected to the substrate 100 through the second solder ball 162.

The second solder ball 162 may be disposed between the first surface 110a of the interposer 110 and an upper surface 100b of the substrate 100. For example as shown in the exemplary embodiment of FIG. 3, the second solder ball 162 may comprise a plurality of discrete solder balls that are spaced apart from each other (e.g., in the X direction and/or Y direction). A top portion (e.g., in the Z direction) of the second solder ball 162 may directly contact the first surface 110a of the interposer 110 and a bottom portion (e.g., in the Z direction) of the second solder ball may directly contact the upper surface 100b of the substrate 100. The second solder ball 162 may contact a conductive socket disposed on an upper surface 100b of the substrate 100. Further, the second solder ball 162 may contact a conductive socket disposed on the first surface 110a of the interposer 110.

In an exemplary embodiment, the second solder ball 162 may be selected from at least one selected from tin (Sn), indium (In), lead (Pb), zinc (Zn), nickel (Ni), gold (Au), silver (Ag), copper (Cu), antimony (Sb), bismuth (Bi), or combinations thereof. However, exemplary embodiments of the present inventive concepts are not limited thereto.

A plurality of logic semiconductor chips may be disposed on the first surface 110a of the interposer 110.

For example, a first logic semiconductor chip 121 may be disposed on the first surface 110a of the interposer 110. The first logic semiconductor chip 121 may be disposed between an upper surface 100b of the substrate 100 and the first surface 110a of the interposer 110. The second solder ball 162 may be disposed on at least one side of the first logic semiconductor chip 121. For example, in the exemplary embodiment of FIG. 3, the second solder ball 162 is disposed on a side of the first logic semiconductor chip and is spaced apart from the first logic semiconductor chip in the X direction. However, exemplary embodiments of the present inventive concepts are not limited thereto.

The first logic semiconductor chip 121 may be spaced apart from an upper surface 100b of the substrate 100 in the Z direction. The first logic semiconductor chip 121 may not be directly connected to an upper surface 100b of the substrate 100 electrically and physically. However, the first logic semiconductor chip 121 may be electrically connected to the substrate 100 through the interposer 110.

The second logic semiconductor chip 122 may be disposed on the first surface 110a of the interposer 110. The second logic semiconductor chip 122 may be spaced apart in the X direction from the first logic semiconductor chip 121 between an upper surface 100b of the substrate 100 and the first surface 110a of the interposer 110. The second solder ball 162 may be disposed on at least one side of the second logic semiconductor chip 122 (e.g., in the X direction).

The second logic semiconductor chip 122 may be spaced apart in the Z direction from an upper surface 100b of the substrate 100. The second logic semiconductor chip 122 may not be directly connected to an upper surface 100b of the substrate 100 electrically and physically. However, the second logic semiconductor chip 122 may be electrically connected to the substrate 100 through the interposer 110.

In an exemplary embodiment, each of the first logic semiconductor chip 121 and the second logic semiconductor chip 122 may be a micro-processor. For example, each of the first logic semiconductor chip 121 and the second logic semiconductor chip 122 may be a central processing unit CPU, a controller, an application specific integrated circuit ASIC, etc.

The first logic semiconductor chip 121 and the second logic semiconductor chip 122 may be electrically and physically connected to the interposer 110 through the third solder ball 163. As shown in the exemplary embodiment of FIG. 3, the third solder ball 163 may comprise a plurality of discrete solder balls that are spaced apart from each other (e.g., in the X direction and/or Y direction). A top portion (e.g., in the Z direction) of the third solder ball 163 may directly contact the first surface 110a of the interposer 110 and a bottom portion (e.g., in the Z direction) of the third solder ball may directly contact a surface of the first logic semiconductor chip 121 and second logic semiconductor chip 122, respectively.

Although the exemplary embodiment shown in FIG. 3 includes two logic semiconductor chips disposed on the first surface 110a of the interposer 110, exemplary embodiments of the present inventive concepts are not limited thereto. For example, in some exemplary embodiments, only one logic semiconductor chip may be disposed on the first surface 110a of the interposer 110. In other exemplary embodiments, three or more logic semiconductor chips that are spaced apart from each other in the X direction and/or the Y direction may be disposed on the first surface 110a of the interposer 110.

The third solder ball 163 may be disposed between the first surface 110a of the interposer 110 and the first logic semiconductor chip 121. The third solder ball 163 may also be disposed between the first surface 110a of the interposer 110 and the second logic semiconductor chip 122.

The third solder ball 163 may be in contact with a conductive socket disposed on the first surface 110a of the interposer 110. The third solder ball 163 may also be in contact with a conductive socket disposed on each of the first logic semiconductor chip 121 and the second logic semiconductor chip 122.

The third solder ball 163 may include at least one selected from tin (Sn), indium (In), lead (Pb), zinc (Zn), nickel (Ni), gold (Au), silver (Ag), copper (Cu), antimony (Sb), bismuth (Bi) or combinations thereof. However, exemplary embodiments of the present inventive concepts are not limited thereto.

A first heat transfer unit 140 may be disposed on an upper surface 100b of the substrate 100. The first heat transfer unit 140 may be exposed on the upper surface 100b of the substrate 100. The first heat transfer unit 140 may be disposed to face each of the first logic semiconductor chip 121 and the second logic semiconductor chip 122. For example, the first heat transfer unit 140 may overlap with each of the first logic semiconductor chip 121 and the second logic semiconductor chip 122 in the Z direction. The first heat transfer unit may comprise a plurality of first heat transfer units. For example, as shown in the exemplary embodiment of FIG. 3, the first heat transfer unit 140 may comprise six discrete first heat transfer units disposed on the upper surface 100b of the substrate and spaced apart in the X direction and/or Y direction. However, exemplary embodiments of the present inventive concepts are not limited thereto and the number of heat transfer units may vary.

The first heat transfer unit 140 may be spaced apart from each of the first logic semiconductor chip 121 and the second logic semiconductor chip 122 in the Z direction. However, exemplary embodiments of the present inventive concepts are not limited thereto. For example, in some other exemplary embodiments, the first heat transfer unit 140 may be in direct contact with each of the first logic semiconductor chip 121 and the second logic semiconductor chip 122.

The first heat transfer unit 140 may be electrically insulated from a conductive socket and wires which are disposed in an internal portion of the substrate 100. Further, the first heat transfer unit 140 may be electrically insulated from the interposer 110.

Although the exemplary embodiment of FIG. 2 depicts six first heat transfer units 140 that are spaced apart from one another in the X direction and the Y direction, exemplary embodiments of the present inventive concepts are not limited thereto. For example, in an exemplary embodiment, the first heat transfer unit 140 may be disposed on an upper surface 100b of the substrate 100 to overlap with a plurality of logic semiconductor chips which are disposed on the first surface 110a of the interposer 110.

The second heat transfer unit 150 may be disposed on an edge side surface of the substrate 100. The second heat transfer unit 150 may be exposed to a lower surface 100a of the substrate 100, an upper surface 100b of the substrate 100 and a side surface of the substrate 100.

The second heat transfer unit 150 may be spaced apart from the first heat transfer unit 140 in the X direction. In an exemplary embodiment, the second heat transfer unit 150 may not overlap the interposer 110 in the Z direction. However, exemplary embodiments of the present inventive concepts are not limited thereto. For example, in other exemplary embodiments, at least a portion of the second heat transfer unit 150 may overlap the interposer 110 in the Z direction.

The second heat transfer unit 150 may be electrically insulated from a conductive socket and wires which are disposed in an internal portion of the substrate 100.

Although FIG. 2 depicts that six second heat transfer units 150 are spaced apart from one another in the X direction and/or the Y direction, exemplary embodiments of the present inventive concepts are not limited thereto. For example, the second heat transfer unit 150 may be disposed on an edge side surface of the substrate 100 so as to correspond to the first heat transfer unit 140 which is disposed on an upper surface 100b of the substrate 100.

The connector 145 may be disposed on an internal portion of the substrate 100. The connector 145 may connect the first heat transfer unit 140 and the second heat transfer unit 150.

The connector 145 may be electrically insulated from a conductive socket and wires which are disposed on an internal portion of the substrate 100.

In an exemplary embodiment, each of the first heat transfer unit 140, the connector 145, and the second heat transfer unit 150 may include at least one of copper Cu and nickel Ni. However, exemplary embodiments of the present inventive concepts are not limited thereto. For example in other exemplary embodiments, each of the first heat transfer unit 140, the second heat transfer unit 150 and the connector 145 may include a material having high heat transfer rate that does not include copper Cu and nickel Ni.

The first heat transfer unit 140, the connector 145 and the second heat transfer unit 150 may discharge heat generated from each of the first logic semiconductor chip 121 and the second logic semiconductor chip 122 to an external portion of the semiconductor package. For example, heat generated from each of the first logic semiconductor chip 121 and the second logic semiconductor chip 122 may be transferred sequentially from the first heat transfer unit 140 overlapping the first logic semiconductor chip and second logic semiconductor chip in the Z direction to the electrically insulated connector 145 in the internal portion of the substrate to the second heat transfer unit 150 on the edge side surface of the substrate. The heat may then be effectively discharged to an external portion of the semiconductor package.

A plurality of memory packages 130 may be disposed on the second surface 110b of the interposer 110. In an exemplary embodiment, a plurality of memory packages 130 may be spaced apart from one another in the X direction and/or the Y direction.

For example, as shown in FIG. 3, each of first to fifth memory packages 131, 132, 133, 134, 135 may be disposed on the second surface 110b of the interposer 110 and spaced apart from one another in the X direction. As shown in FIG. 1, additional memory packages may be disposed on the second surface 110b of the interposer and spaced apart from the first to fifth memory packages 131, 132, 133, 134, 135 in the Y direction.

A plurality of memory packages 130 may be respectively in electrical and physical connection to the interposer 110 through the fourth solder ball 164. As shown in the exemplary embodiment of FIG. 3, the fourth solder ball 164 may comprise a plurality of discrete solders balls that are spaced apart from each other (e.g., in the X direction and/or Y direction).

Although the exemplary embodiments of FIG. 1 includes 15 memory packages 130 disposed on the second surface 110b of the interposer 110, exemplary embodiments of the present inventive concepts are not limited. For example, the number of memory packages 130 disposed on the second surface 110b of the interposer 110 may vary.

Exemplary embodiments of a plurality of memory packages 130 will be exemplarily described with reference to FIG. 4.

Referring to FIG. 4, the first memory package 131 may include a buffer semiconductor chip 10, first to fourth memory semiconductor chips 21, 22, 23, 24, first to fifth connection terminals 31, 32, 33, 34, 35, first to fourth through vias 41, 42, 43, 44, and a mold layer 50.

The buffer semiconductor chip 10 may be disposed on a lowermost portion of the first memory package 131 (e.g., in the Z direction).

First to fourth memory semiconductor chips 21, 22, 23, 24 may be sequentially stacked on the buffer semiconductor chip 10 in the Z direction. Although the exemplary embodiment shown in FIG. 4 includes four memory semiconductor chips stacked on the buffer semiconductor chip 10, the exemplary embodiments of the present inventive concepts are not limited thereto. For example, a number of memory semiconductor chips stacked on the buffer semiconductor chip 10 is not limited and may include fewer than four memory semiconductor chips or five or more memory semiconductor chips.

In an exemplary embodiment, each of first to fourth memory semiconductor chips 21, 22, 23, 24 may be a volatile memory semiconductor chip such as a dynamic random access memory DRAM or a static random access memory SRAM or a nonvolatile memory semiconductor chip such as a phase-change random access memory PRAM, a magnetoresistive random access memory MRAM, a ferroelectric random access memory FeRAM, or a resistive random access memory RRAM. However, exemplary embodiments of the present inventive concepts are not limited thereto.

The first connection terminal 31 may be disposed on a lower surface of the buffer semiconductor chip 10. For example, as shown in the exemplary embodiment of FIG. 4, the first connection terminal 31 may be disposed on a bottom surface (e.g., in the Z direction) of the buffer semiconductor chip 10. The first connection terminal 31 may include a conductive material. The first connection terminal 31 may be electrically connected to the fourth solder ball 164.

The second connection terminal 32 may be disposed between the buffer semiconductor chip 10 and the first memory semiconductor chip 21 (e.g., in the Z direction). The third connection terminal 33 may be disposed between the first memory semiconductor chip 21 and the second memory semiconductor chip 22 (e.g., in the Z direction). The fourth connection terminal 34 may be disposed between the second memory semiconductor chip 22 and the third memory semiconductor chip 23 (e.g., in the Z direction). The fifth connection terminal 35 may be disposed between the third memory semiconductor chip 23 and the fourth memory semiconductor chip 24 (e.g., in the Z direction). The second to fifth connection terminals 32, 33, 34, 35 may include a conductive material. In an exemplary embodiment, each of the first to fifth connection terminals may comprise a plurality of connection materials spaced apart in the X direction. For example, in the exemplary embodiment shown in FIG. 4, the first to fifth connection terminals 31, 32, 33, 34, 35 each include three connection terminals.

The first through via 41 may be disposed to penetrate through the buffer semiconductor chip 10 in the Z direction. The first through via 41 may be connected to each of the first connection terminal 31 and the second connection terminal 32. For example, as shown in the exemplary embodiment of FIG. 4, a top portion (e.g., in the Z direction) of the first connection terminal 31 may contact a bottom portion (e.g., in the Z direction) of the first through via 41. A top portion (e.g., in the Z direction) of the first through via 41 may contact a bottom portion (e.g., in the Z direction) of the second connection terminal 32.

The second through via 42 may be disposed to penetrate through the first memory semiconductor chip 21 in the Z direction. The second through via 42 may be connected to each of the second connection terminal 32 and the third connection terminal 33. For example, as shown in the exemplary embodiment of FIG. 4, a top portion (e.g., in the Z direction) of the second connection terminal 32 may contact a bottom portion (e.g., in the Z direction) of the second through via 42. A top portion (e.g., in the Z direction) of the second through via 42 may contact a bottom portion (e.g., in the Z direction) of the third connection terminal 33.

The third through via 43 may be disposed to penetrate through the second memory semiconductor chip 22 in the Z direction. The third through via 43 may be connected to each of the third connection terminal 33 and the fourth connection terminal 34. For example, as shown in the exemplary embodiment of FIG. 4, a top portion (e.g., in the Z direction) of the third connection terminal 33 may contact a bottom portion (e.g., in the Z direction) of the third through via 43. A top portion (e.g., in the Z direction) of the third through via 43 may contact a bottom portion (e.g., in the Z direction) of the fourth connection terminal 34.

The fourth through via 44 may be disposed to penetrate through the third memory semiconductor chip 23 in the Z direction. The fourth through via 44 may be connected to each of the fourth connection terminal 34 and the fifth connection terminal 35. For example, as shown in the exemplary embodiment of FIG. 4, a top portion (e.g., in the Z direction) of the fourth connection terminal 34 may contact a bottom portion (e.g., in the Z direction) of the fourth through via 44. A top portion (e.g., in the Z direction) of the fourth through via 44 may contact a bottom portion (e.g., in the Z direction) of the fifth connection terminal 35.

A conductive through electrode may be disposed within each of the first to fourth through vias 41, 42, 43, 44. In an exemplary embodiment, the conductive through electrode may include at least one selected from aluminum (Al), gold (Au), beryllium (Be), bismuth (Bi), cobalt (Co), copper (Cu), hafnium (H), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), and zirconium (Zr). However, exemplary embodiments of the present inventive concepts are not limited thereto.

The first to fourth memory semiconductor chips 21, 22, 23, 24 may be electrically connected to the buffer semiconductor chip 10 through the second to fifth connection terminals 32, 33, 34, 35 and the second to fourth through vias 42, 43, 44.

The mold layer 50 may be disposed on an upper surface (e.g., in the Z direction) of the buffer semiconductor chip 10 to cover the first to fourth memory semiconductor chips 21, 22, 23, 24. The mold layer 50 may be disposed between the buffer semiconductor chip 10 and the first memory semiconductor chip 21, between the first memory semiconductor chip 21 and the second memory semiconductor chip 22, between the second memory semiconductor chip 22 and the third memory semiconductor chip 23, and between the third memory semiconductor chip 23 and the fourth memory semiconductor chip 24.

In an exemplary embodiment, the mold layer 50 may include epoxy molding compound EMC or two types or more of silicone hybrid materials. However, exemplary embodiments of the present inventive concepts are not limited thereto.

In an exemplary embodiment, the second to fifth memory packages 132, 133, 134, 135 may have a similar configuration as the first memory package 131 described above. However, the present exemplary embodiments are not limited thereto. For example, in other exemplary embodiments, at least one of the second to fifth memory packages 132, 133, 134, 135 may have a different configuration than the first memory package 131.

The fourth solder ball 164 may be disposed between each of the first to fifth memory packages 131, 132, 133, 134, 135 and the second surface 110b of the interposer 110.

The fourth solder ball 164 may be in contact with a conductive socket disposed on the second surface 110b of the interposer 110. Further, the fourth solder ball 164 may be in contact with the first connection terminal 31 disposed on each of the first to fifth memory packages 131, 132, 133, 134, 135.

In an exemplary embodiment, the fourth solder ball 164 may include at least one selected from tin (Sn), indium (In), lead (Pb), zinc (Zn), nickel (Ni), gold (Au), silver (Ag), copper (Cu), antimony (Sb), bismuth (Bi), or a combination thereof. However, exemplary embodiments of the present inventive concepts are not limited thereto.

In an exemplary embodiment, an additional mold layer may be disposed between the substrate 100 and the interposer 110. For example, the additional mold layer may include epoxy molding compound EMC or two types or more of a silicone hybrid material. However, exemplary embodiments of the present inventive concepts are not limited thereto.

The semiconductor package according to some exemplary embodiments may increase a memory package populated within the semiconductor package by disposing a plurality of logic semiconductor chips electrically and directly connected to the interposer 110 on the first surface 110a of the interposer 110 facing the substrate 100 and disposing a plurality of memory packages 130 electrically and directly connected to the interposer 110 on the second surface 110b of the interposer 110.

Further, the semiconductor package according to some exemplary embodiments may discharge heat generated from a plurality of logic semiconductor chips efficiently to an external portion of the semiconductor package by disposing the heat transfer units 140, 150 on an upper surface 100b of the substrate 100 facing a plurality of logic semiconductor chips.

Hereinbelow, a semiconductor package according to some other exemplary embodiments will be described with reference to FIGS. 5 and 6. The differences from the semiconductor package illustrated in FIGS. 2 and 3 will be highlighted and a description of like elements of the previously described embodiments may not be repeated.

Figure 5:
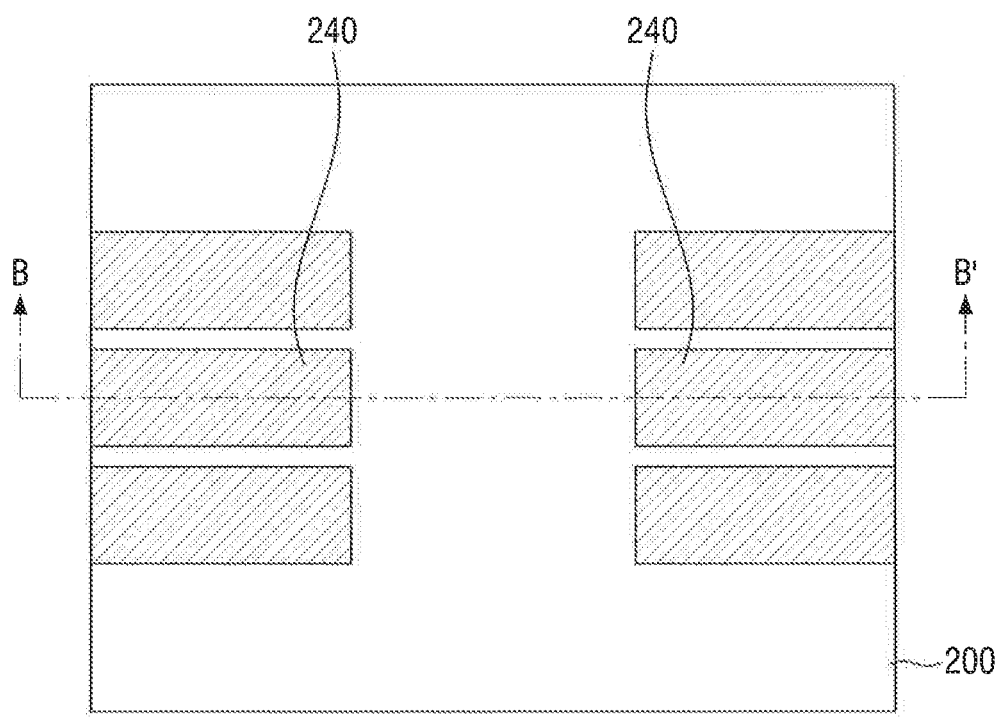
FIG. 5 is a top plan view illustrating a substrate and heat transfer units of a semiconductor package according to an exemplary embodiment of the present inventive concepts.

FIG. 5 is a top plan view illustrating a substrate and heat transfer units of a semiconductor package according to an exemplary embodiment of the present inventive concepts. FIG. 6 is a cross-sectional view taken along line B-B' of FIG. 5 according to an exemplary embodiment of the present inventive concepts.

Figure 6:
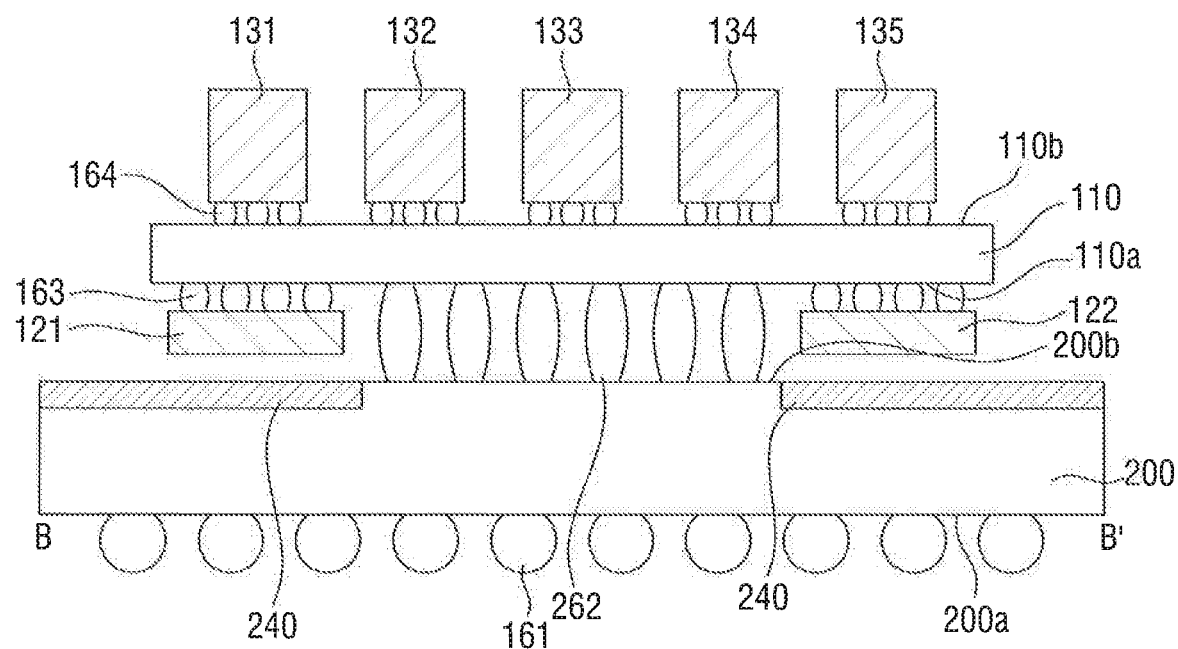
FIG. 6 is a cross-sectional view taken along line B-B' of FIG. 5 according to an exemplary embodiment of the present inventive concepts.

Referring to FIGS. 5 and 6, in the semiconductor package according to an exemplary embodiment of the present inventive concepts, the first heat transfer unit 240 may extend in the X direction to a lateral edge of an upper surface 200b of the substrate 200.

An upper surface of the first heat transfer unit 240 may be exposed on an upper surface 200b of the substrate 200, and a side surface of the first heat transfer unit 240 may be exposed on a side surface of the substrate 200.

The second solder ball 262 may be disposed between the first logic semiconductor chip 121 and the second logic semiconductor chip 122 (e.g., in the X direction). The second solder ball 262 may not overlap the first heat transfer unit 240 in the Z direction. However, exemplary embodiments of the present inventive concepts are not limited thereto. The first solder ball 161 may be disposed on a lower surface 200a of the substrate 200.

Hereinbelow, a semiconductor package according to other exemplary embodiments will be described with reference to FIGS. 7 and 8. The differences from the semiconductor package illustrated in FIGS. 2 and 3 will be highlighted and a description of like elements of the previously described embodiments may not be repeated.

Figure 7:
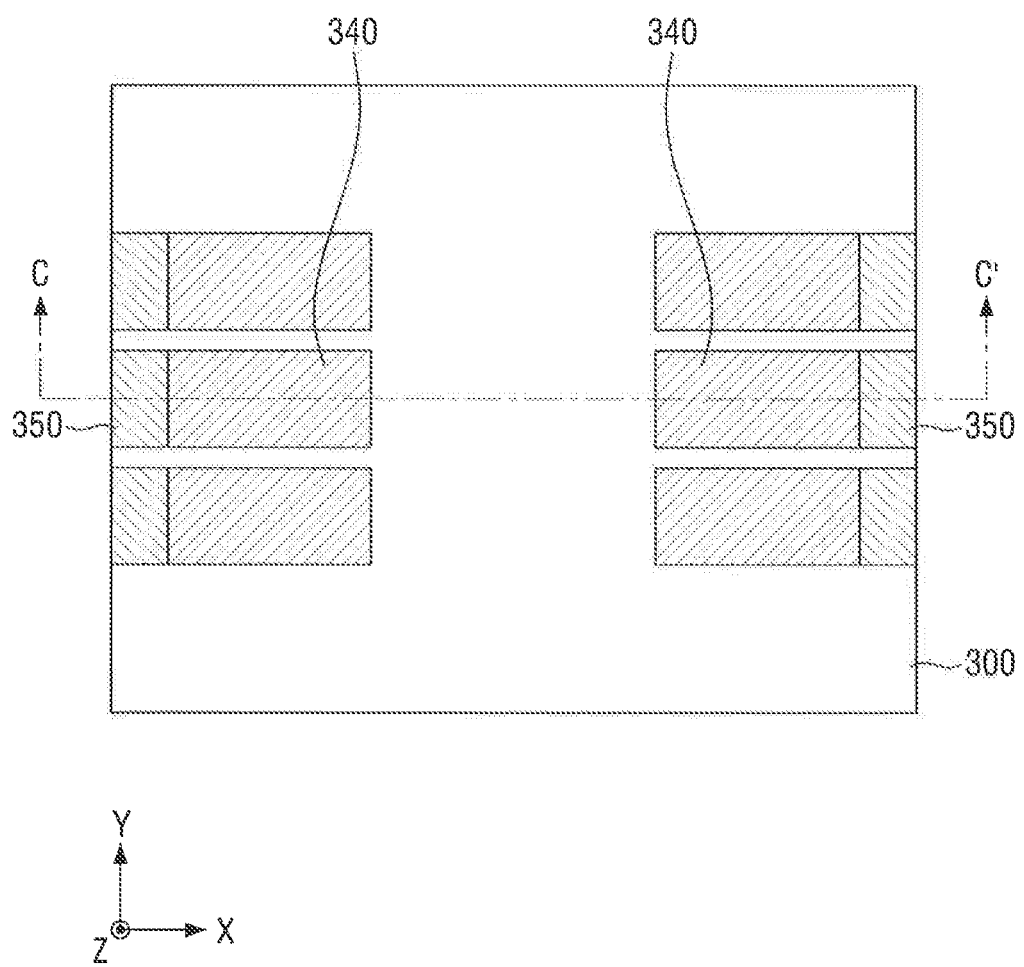
FIG. 7 is a top plan view illustrating a substrate and heat transfer units of a semiconductor package according to an exemplary embodiment of the present inventive concepts.

FIG. 7 is a top plan view illustrating a substrate and heat transfer units of a semiconductor package according to an exemplary embodiment of the present inventive concepts. FIG. 8 is a cross-sectional view taken along line C-C' of FIG. 7 according to an exemplary embodiment of the present inventive concepts.

Figure 8:
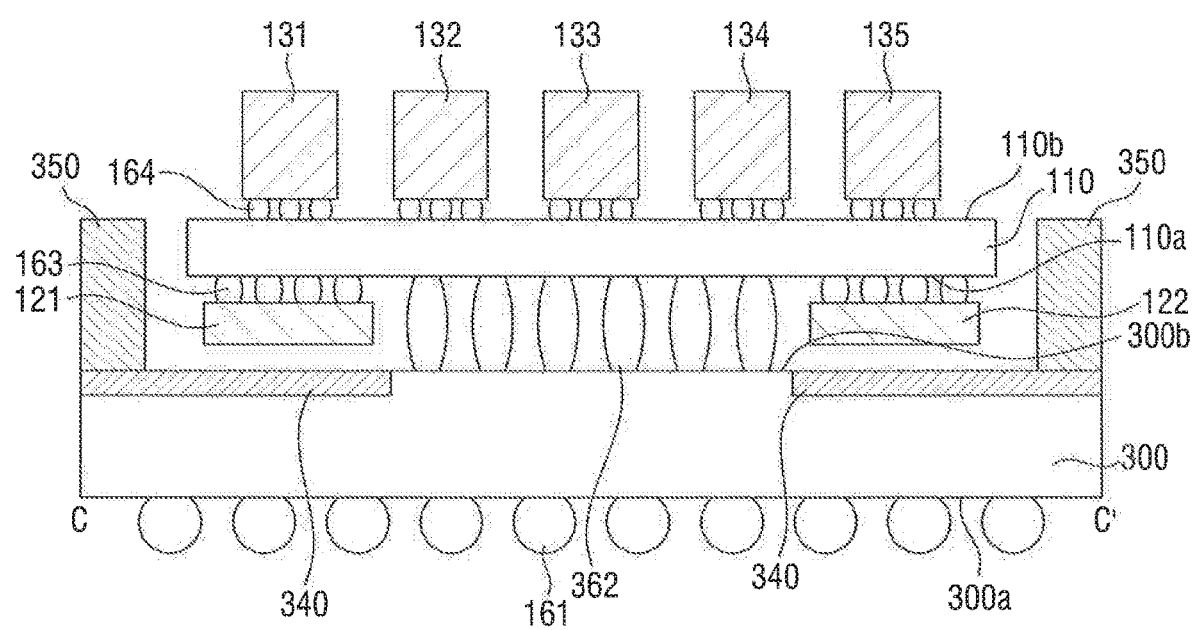
FIG. 8 is a cross-sectional view taken along line C-C' of FIG. 7 according to an exemplary embodiment of the present inventive concepts.

Referring to FIGS. 7 and 8, in the semiconductor package according to an exemplary embodiment of the present inventive concepts, the first heat transfer unit 340 may extend in the X direction to a lateral edge of an upper surface 300b of the substrate 300. The second heat transfer unit 350 may be disposed on the first heat transfer unit 340 (e.g., in the Z direction) on a lateral edge of an upper surface 300b of the substrate 300.

A portion of an upper surface of the first heat transfer unit 340 may be exposed on an upper surface 300b of the substrate 300 and a side surface of the first heat transfer unit 340 may be exposed on a side surface of the substrate 300.

The second heat transfer unit 350 may be in contact with the first heat transfer unit 340. For example, a bottom portion (e.g., in the Z direction) of the second heat transfer unit 350 may be disposed on a top portion (e.g., in the Z direction) of the first heat transfer unit 340 positioned on a lateral edge of the substrate 300. The second heat transfer unit 350 may extend in the Z direction on an edge of an upper surface 300b of the substrate 300. For example, as shown in the exemplary embodiment of FIG. 8, the second heat transfer unit 350 may extend to a height (e.g., distance in the Z direction between a top surface of the second heat transfer unit to an upper surface of the substrate 300) that is approximately the same as the height of a top surface of the interposer 110. However, exemplary embodiments of the present inventive concepts are not limited thereto. The second heat transfer unit 350 may be spaced apart from the interposer 110 in the X direction.

The second solder ball 362 may be disposed between the first logic semiconductor chip 121 and the second logic semiconductor chip 122 (e.g., in the X direction). In an exemplary embodiment, the second solder ball 362 may not overlap the first heat transfer unit 340 in the Z direction. However, exemplary embodiments of the present inventive concepts are not limited thereto. The first solder ball 161 may be disposed on a lower surface 300a of the substrate 300.

Hereinbelow, a semiconductor package according to another exemplary embodiment will be described with reference to FIG. 9. The differences from the semiconductor package illustrated in FIG. 3 will be highlighted and a description of like elements of the previously described embodiments may not be repeated.

Figure 9:
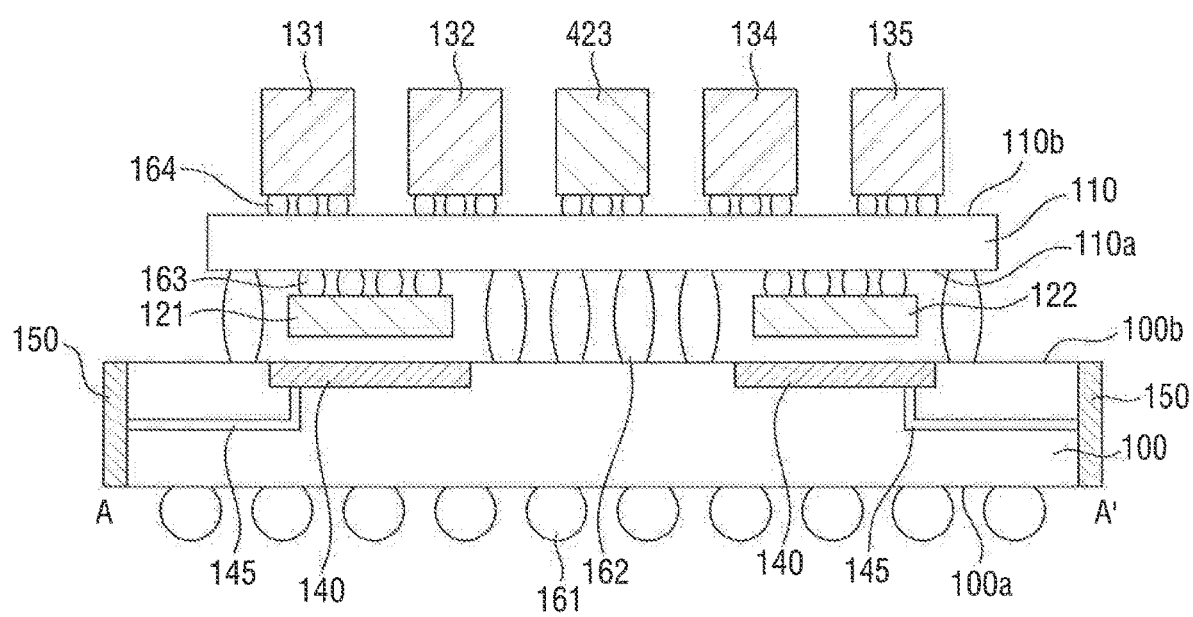
FIG. 9 is a cross-sectional view of a semiconductor package according to an exemplary embodiment of the present inventive concepts.

FIG. 9 is a cross-sectional view of a semiconductor package according to an exemplary embodiment of the present inventive concepts.

In the exemplary embodiment of the semiconductor package shown in FIG. 9, a third logic semiconductor chip 423 may be disposed on the second surface 110b of the interposer 110. In the exemplary embodiment shown in FIG. 9, the third logic semiconductor chip 423 is disposed between the second memory package 132 and the third memory package 134 (e.g., in the X direction). However, exemplary embodiments of the present inventive concepts are not limited thereto and the third logic semiconductor chip 423 may be arranged on different portions of the second surface 110b of the interposer. Furthermore, in some exemplary embodiments, a plurality of third logic semiconductor chips 423 may be disposed on the second surface 110b of the interposer 110 in various different arrangements.

Hereinbelow, a semiconductor package according to an exemplary embodiment will be described with reference to FIG. 10. The differences from the semiconductor package illustrated in FIG. 3 will be highlighted and a description of like elements of the previously described embodiments may not be repeated.

Figure 10:
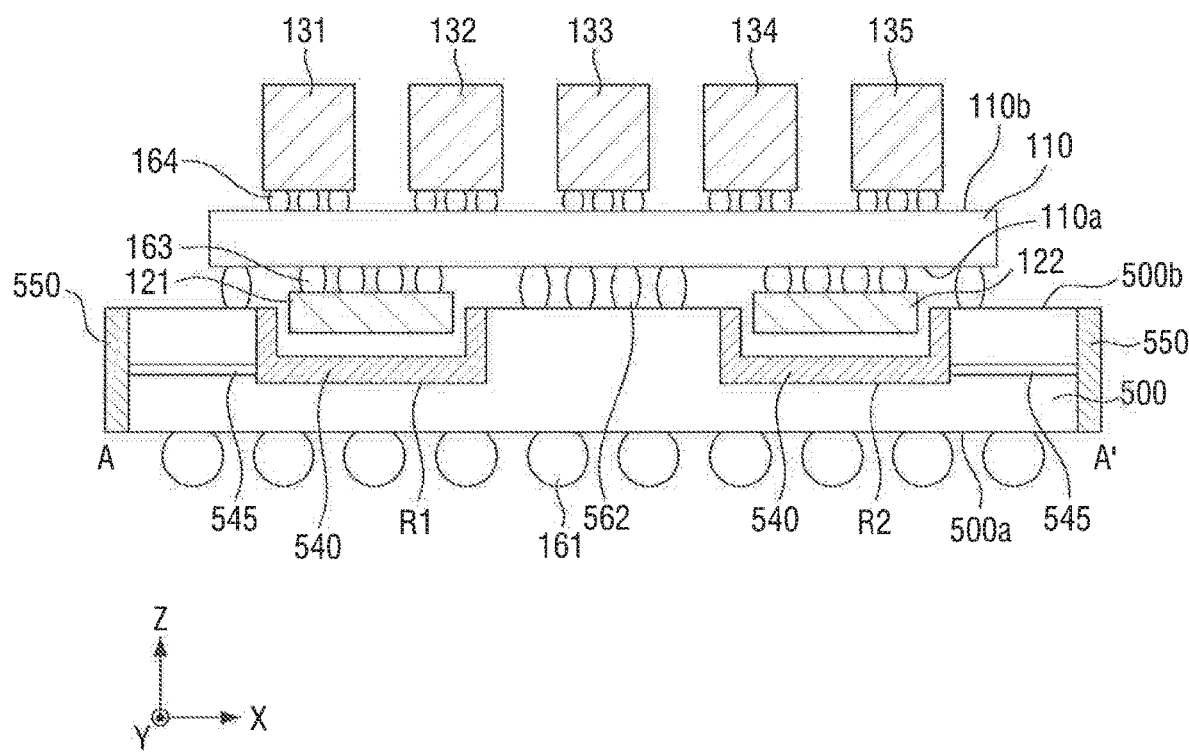
FIG. 10 is a cross-sectional view of a semiconductor package according to an exemplary embodiment of the present inventive concepts.

FIG. 10 is a cross-sectional view of a semiconductor package according to an exemplary embodiment of the present inventive concepts.

Referring to FIG. 10, in the semiconductor package according to some other exemplary embodiments, at least a portion of the first logic semiconductor chip 121 may be disposed within a first recess R1 formed on the substrate 500. Further, at least a portion of the second logic semiconductor chip 122 may be disposed within a second recess R2 formed on the substrate 500. Each of the first and second recesses R1, R2 may be formed to be recessed within the substrate 500 from an upper surface 500b of the substrate 500.

The first heat transfer unit 540 may be disposed along at least one sidewall and a bottom surface of each of the first recess R1 and the second recess R2. For example, as shown in the exemplary embodiment of FIG. 10, the first heat transfer unit 540 may extend along each of the sidewalls of the first recess R1 and second recess R2 and a bottom surface of the first recess and second recess. The sidewalls of the first recess R1 and second recess R2 may extend in the Z direction and the bottom surface of the first recess and second recess may extend in the X direction. However, exemplary embodiments of the present inventive concepts are not limited thereto. The second heat transfer unit 550 may be spaced apart from the first heat transfer unit 540 in the X direction.

The connector 545 may be disposed within the substrate 500. The connector 545 may connect the between the first heat transfer unit 540 and the second heat transfer unit 550. In the exemplary embodiment shown in FIG. 10, the connector 545 extends in the X direction between the first heat transfer unit 540 and the second heat transfer unit 550. However, exemplary embodiments of the present inventive concepts are not limited thereto.

The second solder ball 562 may be disposed between the first surface 110a of the interposer 110 and an upper surface 500b of the substrate 500. The first solder ball 161 may be disposed on a lower surface 500a of the substrate 500.

Hereinbelow, a semiconductor package according to an exemplary embodiment will be described with reference to FIG. 11. The differences from the semiconductor package illustrated in FIG. 3 will be highlighted and a description of like elements of the previously described embodiments may not be repeated.

Figure 11:
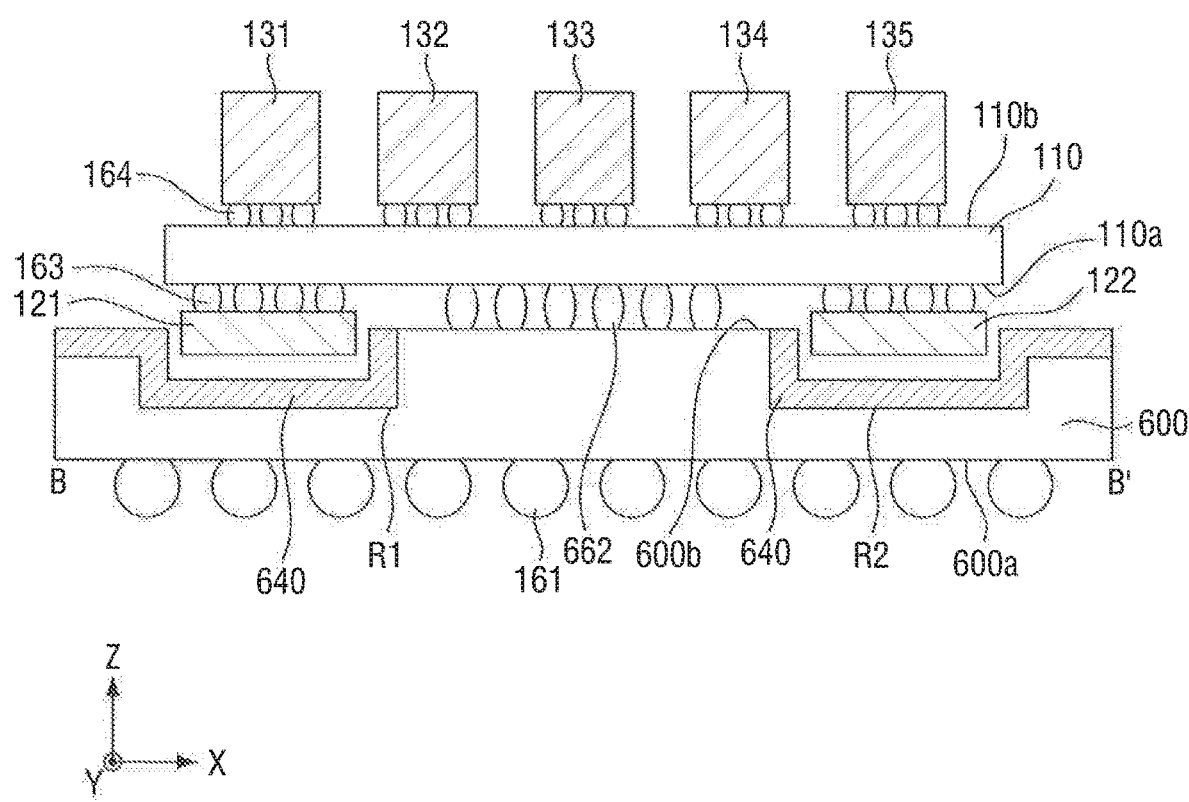
FIG. 11 is a cross-sectional view of a semiconductor package according to an exemplary embodiment of the present inventive concepts.

FIG. 11 is a cross-sectional view of a semiconductor package according to an exemplary embodiment of the present inventive concepts.

Referring to FIG. 11, in the semiconductor package according to an exemplary embodiment of the present inventive concepts, at least a portion of the first logic semiconductor chip 121 may be disposed within a first recess R1 formed on the substrate 600. Further, at least a portion of the second logic semiconductor chip 122 may be disposed within a second recess R2 formed on the substrate 600. Each of the first and second recesses R1, R2 may be formed to be recessed within the substrate 600 from an upper surface 600b of the substrate 600.

The first heat transfer unit 640 may be disposed along at least one sidewall and a bottom surface of each of the first recess R1 and the second recess R2. The first heat transfer unit 640 may also extend in the X direction along the upper surface 600b of the substrate 600 from the portion of the first heat transfer unit 640 disposed on the sidewall to a lateral edge of an upper surface 600b of the substrate 600.

An upper surface of the first heat transfer unit 640 may be exposed to an upper surface 600b of the substrate 600, and a side surface of the first heat transfer unit 640 may be exposed to a side surface of the substrate 600.

The second solder ball 662 may be disposed between the first logic semiconductor chip 121 and the second logic semiconductor chip 122 (e.g., in the X direction). In an exemplary embodiment, the second solder ball 662 may not overlap the first heat transfer unit 640 in the Z direction. However, exemplary embodiments of the present inventive concepts are not limited thereto. The first solder ball 161 may be disposed on a lower surface 600a of the substrate 600.

Hereinbelow, a semiconductor package according to an exemplary embodiment will be described with reference to FIG. 12. The differences from the semiconductor package illustrated in FIG. 3 will be highlighted and a description of like elements of the previously described embodiments may not be repeated.

Figure 12:
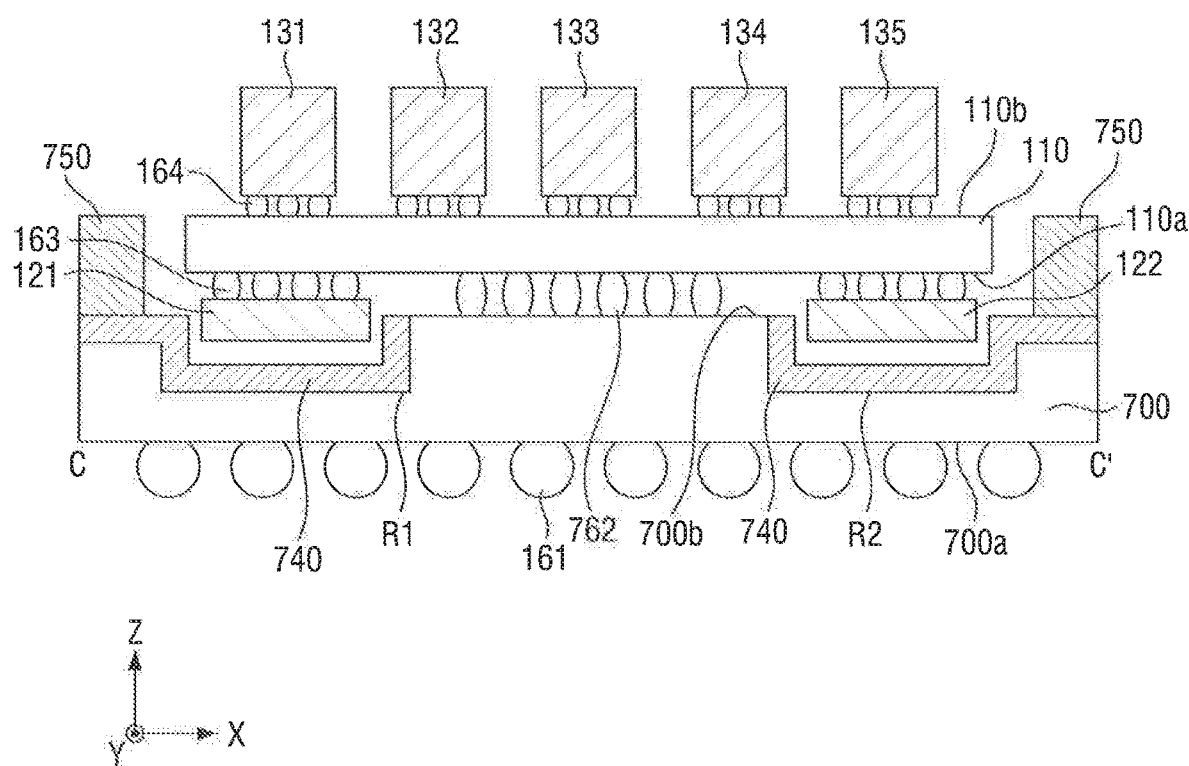
FIG. 12 is a cross-sectional view of a semiconductor package according to an exemplary embodiment of the present inventive concepts.

FIG. 12 is a cross-sectional view of a semiconductor package according to an exemplary embodiment of the present inventive concepts.

Referring to FIG. 12, in the semiconductor package according to an exemplary embodiment of the present inventive concepts, at least a portion of the first logic semiconductor chip 121 may be disposed within a first recess R1 formed on the substrate 700. Further, at least a portion of the second logic semiconductor chip 122 may be disposed within a second recess R2 formed on the substrate 700. Each of the first and second recesses R1, R2 may be formed to be recessed within the substrate 700 from an upper surface 700b of the substrate 700.

The first heat transfer unit 740 may be disposed along at least one sidewall and a bottom surface of each of the first recess R1 and the second recess R2. The first heat transfer unit 740 may extend in the X direction along the upper surface 700b of the substrate 700 from the portion of the first heat transfer unit 740 disposed on the sidewall to a lateral edge of an upper surface 700b of the substrate 700.

The second heat transfer unit 750 may be disposed on the first heat transfer unit 740 (e.g., in the Z direction). For example, the second heat transfer unit 750 may be dispose on lateral edges of the first heat transfer unit 740 and may extend in the Z direction on an edge of an upper surface 700b of the substrate 700. The second heat transfer unit 750 may be spaced apart from the interposer 110 in the X direction.

The second solder ball 762 may be disposed between the first logic semiconductor chip 121 and the second logic semiconductor chip 122 (e.g., in the X direction). In an exemplary embodiment, the second solder ball 762 may not overlap the first heat transfer unit 740 in the Z direction. However, exemplary embodiments of the present inventive concepts are not limited thereto. The first solder ball 161 may be disposed on a lower surface 700a of the substrate 700.

Hereinbelow, a semiconductor package according to an exemplary embodiment of the present inventive concepts will be described with reference to FIG. 13. The differences from the semiconductor package illustrated in FIG. 10 will be highlighted and a description of like elements of the previously described embodiments may not be repeated.

Figure 13:
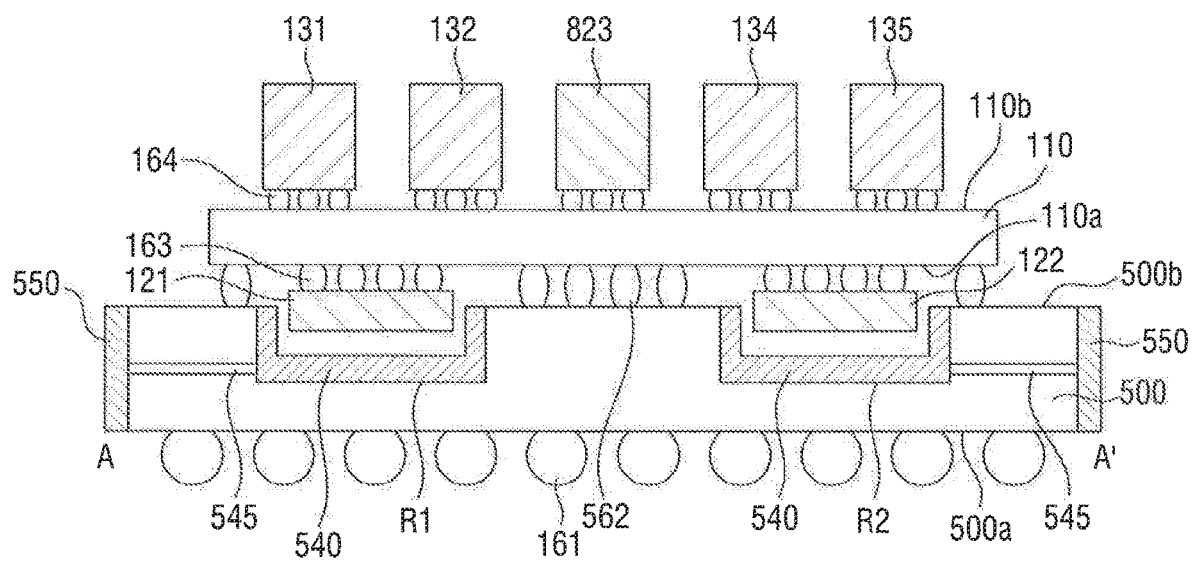
FIG. 13 is a cross-sectional view of a semiconductor package according to an exemplary embodiment of the present inventive concepts.

FIG. 13 is a cross-sectional view of a semiconductor package according to an exemplary embodiment.

Referring to FIG. 13, in the semiconductor package according to an exemplary embodiment, the third logic semiconductor chip 823 may be disposed on the second surface 110b of the interposer 110.

Although the third logic semiconductor chip 823 shown in the exemplary embodiment of FIG. 13 is disposed between the second memory package 132 and the third memory package 134 (e.g., in the X direction), exemplary embodiments of the present inventive concepts are not limited thereto. For example, the position and number of the third logic semiconductor chips 823 disposed on the second surface 110b of the interposer 110 may vary in other exemplary embodiments.

While exemplary embodiments of the present inventive concepts were explained hereinabove with reference to the drawings attached, the present inventive concepts are not limited to the aforementioned exemplary embodiments, but may be fabricated in various different forms, and may be implemented by a person skilled in the art in other specific forms without altering the technical concept or essential characteristics of the present inventive concepts. Accordingly, it will be understood that the exemplary embodiments described above are only illustrative, and should not be construed as limiting.

What is claimed is:

1. A semiconductor package, comprising:
    a substrate;
    an interposer disposed on the substrate, the interposer comprising a first surface facing the substrate and a second surface facing away from the substrate;
    a first logic semiconductor chip disposed on the first surface of the interposer, the first logic semiconductor chip spaced apart from the substrate in a first direction orthogonal to an upper surface of the substrate;
    a first memory package disposed on the second surface of the interposer;
    a second memory package disposed on the second surface of the interposer, the second memory package spaced apart from the first memory package in a second direction that is parallel to the upper surface of the substrate; and
    a first heat transfer unit disposed on a surface of the substrate facing the first logic semiconductor chip, the first heat transfer unit includes an upper surface facing the first logic semiconductor chip that is entirely exposed, the upper surface of the first heat transfer unit is spaced apart from and overlaps the first logic semiconductor chip in the first direction, wherein the first heat transfer unit is electrically insulated from the interposer.

2. The semiconductor package of claim 1, further comprising:
a second heat transfer unit disposed on an edge side surface of the substrate; and
a connector disposed on the substrate, the connector configured to connect the first heat transfer unit and the second heat transfer unit.

3. The semiconductor package of claim 1, wherein the first heat transfer unit extends in the second direction to a lateral edge of the substrate.

4. The semiconductor package of claim 3, further comprising a second heat transfer unit extending in the first direction on the lateral edge of the substrate, the second heat transfer unit spaced apart from the interposer in the second direction, the second heat transfer unit contacting the first heat transfer unit.

5. The semiconductor package of claim 1, wherein the substrate comprises a recess recessed within the substrate, and
at least a portion of the first logic semiconductor chip is disposed within the recess.

6. The semiconductor package of claim 5, wherein the first heat transfer unit is disposed along at least one sidewall and a bottom surface of the recess.

7. The semiconductor package of claim 1, further comprising a second logic semiconductor chip that is disposed on the second surface of the interposer.

8. The semiconductor package of claim 1, wherein the first memory package comprises a plurality of memory semiconductor chips that are stacked in the first direction.

9. The semiconductor package of claim 8, wherein the plurality of memory semiconductor chips include a through via that extends in the first direction, the through via configured to electrically connect the plurality of memory semiconductor chips to one another.

10. The semiconductor package of claim 1, wherein the substrate is a printed circuit board (PCB) substrate.

11. A semiconductor package, comprising:
a substrate comprising a first heat transfer unit disposed on an upper surface of the substrate, the first heat transfer unit includes an upper surface that is entirely exposed;
an interposer disposed on the substrate, the interposer comprising a first surface facing the substrate and a second surface facing away from the substrate, the interposer connected to the substrate;
a logic semiconductor chip disposed on the first surface of the interposer, the logic semiconductor chip overlapping with the exposed upper surface of the first heat transfer unit in a first direction orthogonal to the upper surface of the substrate, the logic semiconductor chip spaced apart from the exposed upper surface of the first heat transfer unit in the first direction, the logic semiconductor chip connected to the interposer; and
a first memory package disposed on the second surface of the interposer, the first memory package connected to the interposer,
wherein the first heat transfer unit is electrically insulated from the interposer.

12. The semiconductor package of claim 11, further comprising a second memory package disposed on the second surface of the interposer, the second memory package is spaced apart from the first memory, package in a second direction that is parallel to the upper surface of the substrate.

13. The semiconductor package of claim 11, wherein the first memory package comprises a plurality of memory semiconductor chips that are stacked in the first direction.

14. The semiconductor package of claim 11, further comprising:
a second heat transfer unit disposed on an edge side surface of the substrate; and
a connector disposed on the substrate, the connector configured to connect the first heat transfer unit and the second heat transfer unit.

15. The semiconductor package of claim 11, wherein the first heat transfer unit extends in a second direction that is parallel to the upper surface of the substrate.

16. The semiconductor package of claim 11, wherein:
the substrate comprises a recess recessed within the substrate; and
at least a portion of the logic semiconductor chip is disposed within the recess.

17. A semiconductor package, comprising:
a substrate comprising a first solder ball disposed on a lower surface;
an interposer disposed on an upper surface of the substrate, the interposer comprising a first surface facing the substrate and a second surface facing away from the substrate;
a second solder ball configured to connect the upper surface of the substrate and the first surface of the interposer;
a first logic semiconductor chip disposed on the first surface of the interposer, the first logic semiconductor chip spaced apart from the upper surface of the substrate in a first direction that is orthogonal to the upper surface of the substrate;
a third solder ball connecting the first surface of the interposer and the first logic semiconductor chip;
a first memory package disposed on the second surface of the interposer, the first memory package comprising a plurality of memory semiconductor chips that are stacked in the first direction;
a second memory package spaced apart from the first memory package in a second direction that is parallel to the upper surface of the substrate;
a fourth solder ball configured to connect the second surface of the interposer and each of the first and second memory packages; and
a first heat transfer unit disposed on the upper surface of the substrate and overlapping the first logic semiconductor chip in the first direction, the first heat transfer unit spaced apart from the first logic semiconductor chip in the first direction,
wherein the first heat transfer unit is electrically insulated from the interposer and the first solder ball.

18. The semiconductor package of claim 17, further comprising:
a second logic chip disposed on the first surface of the interposer, wherein:
the second logic semiconductor chip is spaced apart from the first logic semiconductor chip in the second direction; and
the second logic semiconductor chip is spaced apart from the upper surface of the substrate in the first direction.

19. The semiconductor package of claim 17, wherein the first heat transfer unit includes an upper surface facing the first logic semiconductor chip that is entirely exposed.

\* \* \* \* \*